United States Patent
Levine et al.

(10) Patent No.: US 6,433,326 B1
(45) Date of Patent: Aug. 13, 2002

(54) CMOS/CCD LINE TRANSFER IMAGER WITH LOW DARK CURRENT

(75) Inventors: Peter Alan Levine, West Windsor, NJ (US); John Robertson Tower, Yardley, PA (US); Nathaniel Joseph McCaffrey, Delaware Township; Francis Paul Pantuso, Robbinsville, both of NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/614,765

(22) Filed: Jul. 12, 2000

Related U.S. Application Data

(60) Provisional application No. 60/143,719, filed on Jul. 14, 1999.

(51) Int. Cl.$^7$ ................................................. H04N 3/15
(52) U.S. Cl. ................................... 250/208.1; 348/308
(58) Field of Search ......................... 250/208.1, 214.1, 250/214 R, 214 C; 348/272, 281, 282, 297, 298, 302, 303, 304, 305, 306, 308, 311, 312, 313, 314, 316, 317, 318, 319; 257/290, 291, 292; 438/57, 60, 73, 75

(56) References Cited

U.S. PATENT DOCUMENTS

| | | | |
|---|---|---|---|
| 4,642,877 A | 2/1987 | Garner et al. | 29/571 |
| 4,965,471 A | 10/1990 | Gaboury | 307/446 |
| 5,656,806 A * | 8/1997 | Dautriche | 250/214 R |
| 5,808,329 A | 9/1998 | Jack et al. | 257/188 |
| 5,808,350 A | 9/1998 | Jack et al. | 257/440 |
| 5,904,493 A * | 5/1999 | Lee et al. | 438/57 |
| 5,923,370 A | 7/1999 | Miethig et al. | |
| 6,051,857 A * | 4/2000 | Miida | 257/292 |
| 6,091,449 A * | 7/2000 | Matsunaga et al. | 348/308 |
| 6,160,282 A * | 12/2000 | Merrill | 257/292 |

FOREIGN PATENT DOCUMENTS

| | | |
|---|---|---|
| JP | 03 228373 | 10/1991 |
| JP | 04 186772 | 7/1992 |
| JP | 08 330557 | 12/1996 |
| JP | 09 074180 | 3/1997 |

OTHER PUBLICATIONS

W. F. Kosonocky et al., A schottky–Barrier Image Sensor with 100% Fill Factor, Proceedings of the SPIE, Apr. 18, 1990.

W. F. Kennan et al., A Channel–Stop–Defined Barrier and Drain Antiblooming Structure for Virtual Phase CCD Image Sensors, IEEE Transactions on Electron Devices, US, IEEE Inc., New York, vol. 36, No. 9–I, Sep. 1, 1989, pp. 1634–1638.

B. C. Burkey et al., The Pinned Photodiod for An Interline–Transfer CCD Image Sensor, Proceeding of the International Electron Devices Meeting, US, New York, IEEE, vol. PROC. 1984, Dec. 9, 1984, pp. 28–31

International Search Report, Apr. 9, 2001.

* cited by examiner

*Primary Examiner*—Stephone Allen
(74) *Attorney, Agent, or Firm*—William J. Burke

(57) ABSTRACT

A method and apparatus for low light imaging in which a plurality of relatively small detectors forming a line is coupled to a respective cell of a CCD register. A charge indicative of detected image information is provided to the respective cells after the cells are substantially discharged via a drain. The register is read by a control element to define therefrom a row of pixel information.

28 Claims, 2 Drawing Sheets

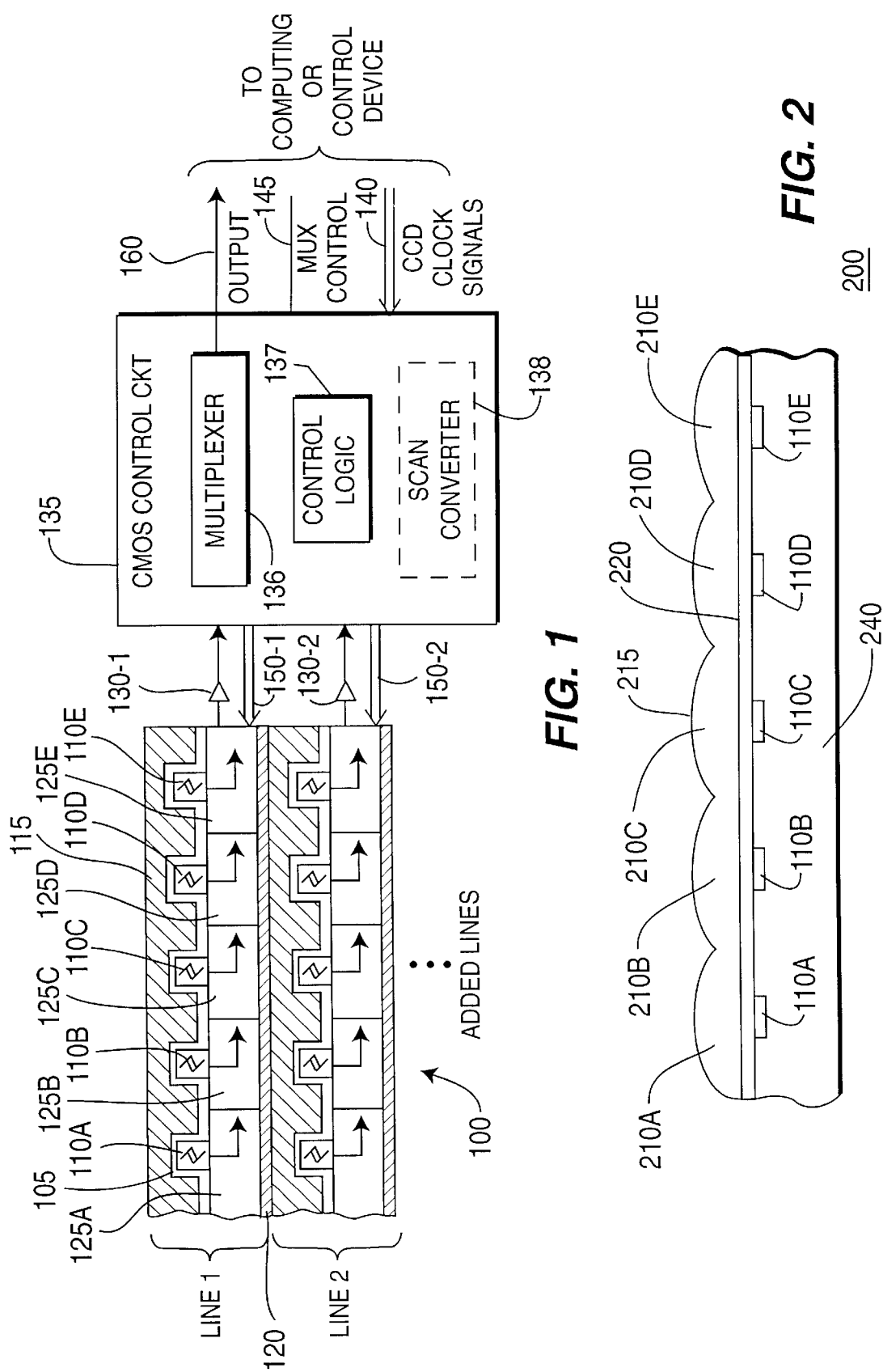

CMOS/CCD LINE TRANSFER IMAGER WITH LOW DARK CURRENT

CROSS-REFERENCE TO RELATED APPLICATIONS

This application claims the benefit of U.S. Provisional Application No. 60/143,719 filed Jul. 14, 1999 and incorporated herein by reference in its entirety.

The invention is generally related to image processing systems and, more specifically, to a method and apparatus for low light imaging.

BACKGROUND OF THE INVENTION

Night vision systems have become increasingly reliant on infrared imaging and detection in recent years. Present silicon imagers often require auxiliary cooling to achieve useful night vision imaging. This is because of the need to reduce the dark current level within the imager. That is, within a charge coupled device (CCD) imager, the dark current shot noise adds in quadrature with the imager readout noise, thereby degrading the useful signal-to-noise ratio. Typically, a thermoelectric cooler is used to reduce the temperature of the CCD imager and, therefore, reduce the imager dark current level. Unfortunately, such a thermoelectric cooler greatly adds to both the weight and power consumption of the resulting imaging device.

Therefore, it is seen to be desirable to provide a night vision imaging apparatus having a dark current that is low enough to avoid the use of a thermoelectric cooler.

SUMMARY OF THE INVENTION

The disadvantages of the prior art are overcome by the present invention of an imager architecture in which low imager dark current levels are achieved without auxiliary cooling devices. Imaging apparatus according to an embodiment of the present invention utilizes a line transfer imager with horizontal line readout and vertical complementary metal oxide (CMOS) scanning. Specifically, a two dimensional array of charge coupled devices having relatively small individual areas with respect to the line pitch are read as respective horizontal lines using a low noise CCD output stage. Select lines and a shift register or decoder using CMOS circuits integrated with the CCD lines are used. An optical lens array is used to increase the optical fill factor to compensate for the relatively small area covered by the deletions of the CCD array. Within the CCD array, unused area is filled with drains to reduce dark current and provide blooming control. Moreover, drain and dump gates at the top of the detectors provide additional blooming control and electronic shutter control. In one embodiment of the invention, virtual gate detectors with charge storage are used to simplify the overall device structure and reduce dark current.

A method according to an embodiment of the invention comprises the steps of: clearing dark current from a horizontal charge coupled device (CCD) register to a corresponding horizontal register dump drain; loading a detector signal into the CCD register; selecting the CCD register and reading out the contents of the register; and repeating the preceding steps for each horizontal line of a CCD array.

BRIEF DESCRIPTION OF THE DRAWINGS

The teachings of the present invention can be readily understood by considering the following detailed description in conjunction with the accompanying drawings, in which:

FIG. 1 depicts a functional block diagram of a line transfer imager architecture;

FIG. 2 depicts a graphical representation of an imager using a lens array; and

To facilitate understanding, identical reference numerals have been used, where possible, to designate identical elements that are common to the figures.

DETAILED DESCRIPTION

Figure 3:
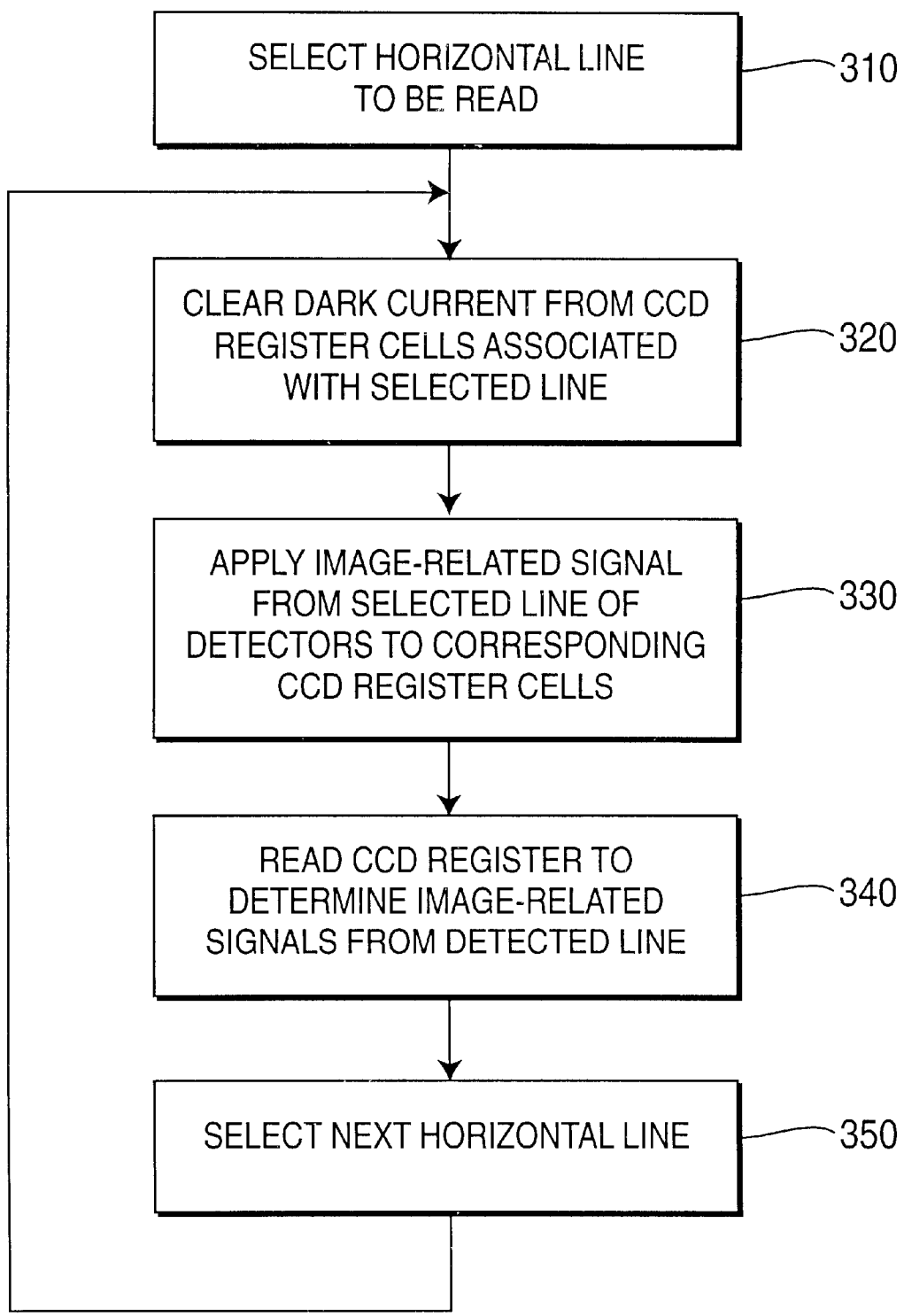
FIG. 3 depicts a flow diagram of a method according to the present invention.

FIG. 1 depicts a functional block diagram of a line transfer imager architecture according to the invention. Specifically, FIG. 1 depicts a two line by five picture element (pixel) portion of an imager and associated control circuitry. It will be understood that while only a first of the horizontal lines of the image architecture will be discussed in detail, the discussion is equally applicable to the second and any remaining horizontal lines. Moreover, within the context of a multiple line imager, each of the lines is processed in sequence to provide an image frame defined by the number of lines processed and the number of pixels represented by each line. Finally, it will be understood while the invention is described in terms of horizontal lines and the various components used to form an imager with respect to the horizontal lines, the invention may equally apply to vertical lines or other "slices" of picture element-related structure within an imager.

Referring to the first line, LINE 1, of the imager architecture 100 a plurality of detectors 110A through 110E (collectively detectors 110), illustratively pinned virtual gate detectors or diode detectors, is provided. A control gate 105 is formed about each of the detectors 110. A blooming drain and dark current removal layer 115 is formed about the control gate 105. Each of a plurality of cells 125A through 125E (collectively cells 125) of a charge coupled device (CCD) register controllably receives charge from a respective detector 110. A dump drain 120 cooperates with each of the cells 125 within the CCD register to controllably remove dark current from the cells 125, prior to the cells 125 receiving an image-related charge from corresponding detectors 110.

A CMOS control circuit 135 comprising a multiplexer 136 and control logic 137 receives CCD clock signals 140 and multiplex control signals 145 from, for example, an external computing device (not shown). The CCD clock signals 140 are propagated according to the control logic 137 to each line of the imager via respective signal paths 150. The CCD register associated with a detector line to be read, under control from the CMOS clock circuit 135, operates to serially shift a charge level imparted by each detector 110 to its respective CCD register cell 125 to an amplifier 130, such as a floating diffusion amplifier. The amplifier 130 couples the output signal of the representative of a CCD register (that is, the charge or voltage level) to the multiplexer 136 within the CMOS control circuit 135. The CMOS control circuit 135 responsively provides an output signal 160 indicative of the pixel values of the read horizontal line to an external computing or control device (not shown).

In a preferred embodiment of the invention, the detectors 110 are smaller in area relative to the line pitch in order to reduce dark current. Moreover, the detectors 110 are preferably formed using small virtual gate detectors with charge storage to simplify the structure and further reduce dark current. Additionally, dark current present within the horizontal CCD register is dumped via dump drain 120 immediately prior to the loading of the detector signal from the detectors 110 to the corresponding cell of the CCD register 125. In this manner, the deleterious effects of dark current are greatly reduced. While these detectors generate very little dark current, they also do not collect very much light.

Therefore, in the preferred embodiment of the present invention, an optical focusing element or lens is associated with each detector 110. Specifically, an array of lenses corresponding to and aligned with an array of detectors is laminated to, or otherwise adhered to, the array of detectors. In the case where the detectors 110 are extremely small, a significant amount of light bending is required to focus the received light on the detector 110. In this case, the lens array should be formed using a high index of refraction material.

FIG. 2 depicts a graphical representation of an imager using a lens array. Specifically, FIG. 2 depicts a graphical representation 200 showing only portions of the imager and corresponding optical processing elements. The imager 200 of FIG. 2 comprises a silicon substrate 240 having formed thereon a plurality of detectors 110A through 110E (collectively detectors 110), illustratively pinned virtual gate detectors or diodes. A lens array 215 is disposed above the silicon substrate 240 and detectors 110. The lens array 215 comprises a plurality of focusing elements 210A through 210E (collectively focusing elements 210). Each of the focusing elements 210 focuses received light upon a respective detector 110. The lens array 215 comprises a high index of refraction material. Optionally, an index matching layer 220 is disposed between the lens array 215 and the detectors 110 to perform an index of refraction matching function such that the light focused by the focusing elements 210 is appropriately received by the corresponding detectors 110. By utilizing the lens array 215, an optical fill factor approaching 100% may be achieved.

FIG. 3 depicts a flow diagram of a method according to the present invention. The method 300 of FIG. 3 depicts an exemplary method for use with an imager formed according to the architecture described above with respect to FIG. 1. It is noted that the method 300 of FIG. 3 operates to read only one line of an array of imaging elements at one time. It will be appreciated by those skilled in the art that various portions of the method may be used to read multiple lines at one time or to perform preliminary operations on horizontal lines scheduled to be read, e.g., controllably draining dark current from lines not yet read.

The method 300 of FIG. 3 is entered at step 310 when a horizontal line of detectors within an array of detectors is selected to be read. A horizontal line is selected by the control logic 137 within the CMOS control circuit 135 using the control signals propagated via signal path 150. The method 300 then proceeds to step 320, where the dark current from each charge coupled device (CCD) cell within at least the line-corresponding CCD register is cleared. As previously noted, each CCD cell has associated with it a respective detector within the line of detectors of the detector array. The dark current is removed from the CCD register cells by controllably dumping the dark current via, for example, dump drain 120. The method 300 then proceeds to step 330.

At step 330, the image-related signal (e.g., voltage level or charge level) from each detector 110 within the selected line of detectors is coupled to the corresponding CCD register cell. That is, at step 330 the image related signals from the line of detectors are stored in the corresponding cells of the CCD register. The method 300 then proceeds to step 340.

At step 340, the CCD register is read to determine the image-related signals provided by the line of detectors. That is, at step 340, the CCD register is read by converting each imager-related signal stored within the CCD register cells to a corresponding signal level which is then read by, for example, an analog-to-digital converter or other signal processing element (not shown). The CCD register is preferably accessed in a serial fashion or, in an alternate embodiment, a parallel fashion. Preferably, the charge stored within the horizontal line CCD register is sequentially shifted to the imager output signal path 160 within the CMOS control circuit 135. The method 300 then proceeds to step 350, where the next horizontal line to be read is selected, and proceeds to step 320.

The readout structure of the above-described imager, and unused portions of the pixel (i.e., non detector area surrounding each detector), are designed in a manner tending to reduce dark noise contributions relative to the virtual gate or diode detectors. In the preferred embodiment of the invention, an imager is formed using a horizontal CCD readout register controlled by on-chip CMOS circuits to locally dump current dark current from each line register prior to the transfer of charge from the light detecting area to the readout register. The maximum dark current integration time for dark current added to the photoelectric signal is one time line, or approximately 53 microseconds for RS-170 standard video signals. Using a split horizontal line with two outputs, the added dark current integration time is reduced by a factor of 2. It is noted that the present current transfer and inter line transfer CCD imagers have maximum amount of readout associated dark current integration time of one frame time, which is approximately 1,000 times greater than a split line design formed according to the teachings of the present invention for a 500 line imager. Another advantage is that the imager may be fabricated entirely using a standard CMOS/CCD process on, illustratively, six inch wafers, thereby eliminating thinning or back side illumination processing, TE cooling and associated thermal subsystem and wafer level application of micro lenses.

Since the above-described invention uses detectors 110 that are relatively small (to reduce dark current), the light sensitive portion of the imager is a low fill factor array of pinned virtual gates having bulk limited dark current of less than, illustratively, 50 picoamps per centimeter squared. An incoming optical signal is coupled to each of the relatively small detectors 110 by a respective focusing element 210 within the lens array 215. In this manner, the apparent fill factor of the imager is greatly increased. Thus, the pinned virtual gates or diodes are selected to reduce dark current to at least a level that may be appropriately compensated for by the dump drain 120.

An additional consideration is the amount of time necessary to sequentially shift the contents of the CCD registers 125 to the CMOS control circuit 135. In this case, the increase in dark current over the time to shift the last pixel value in the line to the CMOS control circuit 135 may be considered a design parameter. Another design parameter is the ability of the lens array to increase the fill factor of the imager sufficiently. Such ability depends upon the focusing element material used (i.e., the index of refraction of the focusing material) and other factors known to those skilled in the art. The combination of small detector elements, the lens array, controllable dark current dumping and sequential shifting of image-related charge levels to a control circuit provides an efficient and inexpensive imaging apparatus suitable for many applications.

In one embodiment of the invention, each CCD register to receive image-indicative charge levels is cleared (i.e., discharged) by reading the register (without using the received data) prior to imparting charge into the register from the detectors. The register is then read again to receive the useful data. In one embodiment of the invention, where a plurality of CCD registers are to be read in sequence, two CCD registers are read at a time. The first CCD register is read to retrieve image-indicative information, while the second CCD register is read to clear residual charge or dark current from the register prior to imparting image-indicative charge to the register. For example, referring to FIG. 1, assuming that line 1 has previously been cleared, lines 1 and 2 are read simultaneously. The data from line 1 is processed, while the data from line 2 is discarded. Next, line 2 and line 3 (not shown) are read. The data from line 2 is processed, while the data from line 3 is discarded. This sequence continues for each line used within an imager. Control of the register is provided in the manner described above, though only the output of the register providing useful data needs to be provided to the other processing circuitry.

In another embodiment of the invention, the CCD registers are read at a very high speed, thereby avoiding the build up of dark current. In this embodiment of the invention, an optional scan converter 138 (see FIG. 1) within the CMOS control circuit 135 (or external to the CMOS control circuit in, for example, a computing or control device) is used to convert the high speed scan rate used to read the CCD registers to a scan rate appropriate to the imagery to be presented. For example, in the case of an imaging device according to the invention being used to provide NTSC imagery, a horizontal scan rate of approximately 53 microseconds per line is appropriate. Thus, the optional scan converter 138 converts each horizontal line, as represented by each CCD register, from the scan rate used to read the CCD register (e.g., 25 microseconds, 10 microseconds, 1 microsecond or the like depending upon the technology used to construct the imager) to a 53 microsecond horizontal line. In this manner, the CCD registers may be accessed very quickly, thereby avoiding the build up of dark current, while the optional scan converter 138 converts the rapidly acquired data into an appropriately timed horizontal scan line. It is noted that high-speed reading of simultaneous registers is also contemplated by the inventors, as well as high speed reading of drain-discharged registers. the combinations are also used by the invention.

It will be understood by those skilled in the art informed by the teachings of the present invention that many different semiconductor processes may be used to implement the present invention. Additionally, many different semiconductor materials may be used. For example, while the invention is described primarily within the context of a silicon semiconductor processing environment, germanium and other semiconductor materials known to those skilled in the semiconductor arts may be readily employed to effect the present invention. The inventor contemplates the use of all these materials.

An imager formed according to the present invention provides physical imaging at star light levels with no auxiliary cooling. The horizontal inter line transfer architecture reduces readout multiplexer dark current by 100× compared to conventional CCD readout multiplexers. The pinned virtual gate detectors representing each pixel are formed using a minimal amount of area, thereby giving the lowest possible detector dark current contribution. Additionally, by having reversed bias drains surrounding the pinned virtual gates, dark current is removed from the unused portions of the pixel-representative portion of the detector layer and, additionally, serves as blooming control to reduce optical overloads on the detector.

Imager arrays formed according to the present invention provide for virtual scanning using a CMOS multiplexer with low noise floating diffusion output amplifiers at video frame rates. It is also noted that the minimal power dissipation and low light achieved using the "uncooled" imager may be formed using five volt signal rules within the context of an existing combined CMOS and CCD process used by the Sarnoff Corporation of Princeton, N.J.

In one application of the invention, a real time night vision (RTNV) camera utilizing the present invention does not require the use of a shutter due to the inherently low transfer smear of the above-described imager.

The above-described invention has been described primarily within the context of detectors receiving evening light or star light. However, it will be appreciated by those skilled in the art that the detectors 110 used in the present invention may be of the type for receiving infrared (IR) radiation, sun light, star light, artificial light, and, generally speaking, any form of image-related radiation. Depending upon the type of radiation received via the detectors 110, the lens array 215 used to focus the radiation on the detector may be modified to accommodate the type of radiation detected. Moreover, in one embodiment of the invention, a plurality of detector types may be employed within the context of an imager array. In this embodiment of the invention, for example, both infrared and star light detectors may be employed to provide coordinated imagery for use in various application, such as surveillance applications. In the case of multiple detector type arrays, modifications to the drain circuitry and register circuitry are made to accommodate any differences between the detector outputs. Such modifications will be readily apparent to those skilled in the art and informed by the teachings of the present invention.

Although various embodiments which incorporate the teachings of the present invention have been shown and described in detail herein, those skilled in the art can readily devise many other varied embodiments that still incorporate these teachings.

What is claimed is:

1. Apparatus, comprising:
    a plurality of detectors arranged as a plurality of lines, for receiving image information and providing a proportionate level of charge therefrom;
    a plurality of cells forming a charge coupled device (CCD) register, each of said detectors having associated with it a respective cell;
    a drain gate, for controllably removing charge from said plurality of cells; and
    a controller, for causing said drain gate to sequentially remove residual charge from said cells along one of said plurality of lines at a time, causing said cells to receive charge levels proportionate to said respective detectors, and retrieve charge-level indicative information from said cells.

2. The apparatus of claim 1, wherein each of said detectors is formed in a common substrate, said substrate including thereon non-detector portions operating as drains to reduce dark current charge proximate said detectors.

3. The apparatus of claim 1, wherein each of said detectors is formed in a common substrate, said substrate including thereon non-detector portions operating as drains to provide blooming control.

4. The apparatus of claim 1, further comprising a plurality of focusing elements, each of said focusing elements having associated with it a respective detector, said focusing elements operating to increase the amount of image information applied to each detector.

5. The apparatus of claim 4, wherein:
    said detectors and said respective focusing elements are arranged as said plurality of lines forming thereby a detector array, wherein each of said plurality of detector lines has associated with it a respective register; and said controller processing each of said detector lines in sequence by discharging said respective register, causing each cell within said respective register to receive charge from a corresponding detector, and retrieving charge-indicative information from said register.

6. The apparatus of claim 1, wherein a drain and dump gate is formed proximate said plurality of detectors to controllably provide dark current reduction and blooming control.

7. The apparatus of claim 6, wherein said drain and dump gates are used to provide shutter control.

8. The apparatus of claim 1, wherein said detectors comprise one of a pinned virtual gage detector or a diode detector.

9. The apparatus of claim 1, wherein said detectors are responsive to one of visible light and infrared radiation.

10. The apparatus of claim 1, further comprising:

an amplifier, coupled between said CCD register and said controller, for adapting a signal level to charge levels of said CCD register cells.

11. The apparatus of claim 10, wherein said amplifier comprises a floating diffusion amplifier.

12. Apparatus, comprising:

a plurality of detectors arranged as a plurality of lines for receiving image information and providing a proportionate level of charge therefrom;

a plurality of cells forming a charge coupled device (CCD) register, each of said detectors having associated with it a respective cell; and a controller, for sequentially removing residual charge from said cells along one of said plurality of lines at a time, causing said cells to receive charge levels proportionate to said respective detectors, and retrieving charge-level indicative information from said cells.

13. The apparatus of claim 12, wherein said controller removes residual charge from said cells by reading said register prior to causing said cells within said register to receive respective charge levels from said detectors.

14. The apparatus of claim 12, wherein a plurality of CCD registers are arranged to form a corresponding plurality of lines in a frame, said controller operating to read two CCD registers simultaneously, a first of said CCD registers being read to clear residual charge from cells forming said first register, a second of said CCD registers being read to receive charge levels proportionate to detectors associated with cells therein, said second CCD register having been cleared using a previous read operation.

15. The apparatus of claim 12, wherein each of said detectors is formed in a common substrate, said substrate including thereon non-detector portions operating as drains to reduce dark current charge proximate said detectors.

16. The apparatus of claim 12, wherein said detectors and said cells are formed on a common substrate.

17. The apparatus of claim 12, wherein said apparatus is formed using a semiconductor material comprising at least one of silicon and geranium.

18. The apparatus of claim 12, further comprising:

a scan converter, for adapting the scan rate of the retrieved charge-level indicative information from the cells and adapting said scan rate to the predetermined scan rate.

19. An integrated circuit formed using a complementary metal-oxide semiconductor/charge coupled device (CMOS/CCD) process on a common substrate, said integrated circuit comprising:

a plurality of detectors arranged as a plurality of lines for receiving image information and providing a proportionate level of charge therefrom;

a plurality of cells forming a charge coupled device (CCD) register, each of said detectors having associated with it a respective cell;

a drain gate, for controllably removing charge from said plurality of cells; and a controller, for causing said drain gate to sequentially remove residual charge from said cells along one of said plurality of lines at a time, causing said cells to receive charge levels proportionate to said respective detectors, and retrieve charge-level indicative information from said cells.

20. The integrated circuit of claim 19, wherein each of said detectors is formed in a common substrate, said substrate including thereon non-detector portions operating as drains to reduce dark current change proximate said detectors.

21. The integrated circuit of claim 19, wherein each of said detectors is formed in a common substrate, said substrate including thereon non-detector portions operating as drains to provide blooming control.

22. The integrated circuit of claim 19, further comprising a plurality of focusing elements, each of said focusing elements having associated with it a respective detector, said focusing elements operating to increase the amount of image information applied to each detector.

23. The integrated circuit of claim 22, wherein:

said detectors and said respective focusing elements are arranged as said plurality of lines forming thereby a detector array wherein each of said plurality of detector lines has associated with it a respective register;

said controller processing each of said detector lines in sequence by discharging said respective register, causing each cell within said respective register to receive charge from a corresponding detector, and retrieving charge-indicative information from said register.

24. A method, comprising the steps of:

clearing dark current from a charge coupled device (CCD) register;

loading detector signals into corresponding cells within the CCD register;

retrieving the contents of the CCD register; and repeating the preceding steps for each line of a CCD array.

25. The method of claim 24, wherein said step of clearing comprises the step of reading said CCD register prior to said step of loading.

26. The method of claim 25, wherein said step of clearing and said step of loading are simultaneously performed on respective CCD registers.

27. The method of claim 24, wherein said detector signals are provided by respective detectors formed in a common substrate, said substrate including thereon non-detector portions operating as drains to provide blooming control.

28. A method, comprising:

sequentially accessing each pair of adjacent lines of charge coupled device (CCD) cells within an array of CCD cells, each cell receiving image indicative charge from a respective detector;

for each pair of adjacent lines of CCD cells, said accessing operating to retrieve image indicative charge from a first adjacent line of CCD cells and to clear dark current from a second line of CCD cells, said first adjacent line of CCD cells having been substantially cleared of dark current by an immediately preceding access.

* * * * *